United States Patent
Biswas et al.

(10) Patent No.: US 9,864,008 B2
(45) Date of Patent: Jan. 9, 2018

(54) ELECTRIC POWER SYSTEM CIRCUIT BREAKER TRIP DIAGNOSTIC

(71) Applicant: Schweitzer Engineering Laboratories, Inc., Pullman, WA (US)

(72) Inventors: Saugata Swapan Biswas, Pullman, WA (US); Anurag K. Srivastava, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 860 days.

(21) Appl. No.: 14/268,927

(22) Filed: May 2, 2014

(65) Prior Publication Data

US 2015/0276877 A1    Oct. 1, 2015

Related U.S. Application Data

(60) Provisional application No. 61/972,558, filed on Mar. 31, 2014.

(51) Int. Cl.
  *G01R 31/327*    (2006.01)

(52) U.S. Cl.
  CPC ................. *G01R 31/3275* (2013.01)

(58) Field of Classification Search
  CPC ............................ G01R 31/3275; G01R 31/327
  USPC .......................................................... 702/58
  See application file for complete search history.

(56) References Cited

U.S. PATENT DOCUMENTS

| | | |
|---|---|---|
| 3,777,215 A | 12/1973 | D'Esopo |
| 4,237,512 A | 12/1980 | Forford |
| 4,896,254 A | 1/1990 | Bennett |
| 4,967,304 A | 10/1990 | Dougherty |
| 5,157,575 A | 10/1992 | Feltis |
| 5,629,869 A * | 5/1997 | Johnson ............. H01H 11/0062 361/88 |
| 5,751,532 A | 5/1998 | Kanuchok |

(Continued)

FOREIGN PATENT DOCUMENTS

WO    2011/157306    12/2011

OTHER PUBLICATIONS

B. Stephen, S.M. Strachan, S.D.J. McArthur, J.R. McDonald and K. Hamilton, "Design of trip current monitoring system for circuit breaker condition assessment," IET Gener. Transm. Distrib. vol. 1, No. 1, Jan. 2007.

(Continued)

*Primary Examiner* — Mohamed Charioui
(74) *Attorney, Agent, or Firm* — Jared L. Cherry; Richard M. Edge

(57) ABSTRACT

Disclosed herein are various systems and methods for monitoring the health of a circuit breaker. In various embodiments, a system may receive a voltage measurement across a trip coil assembly associated with a circuit breaker. The system may further receive a current measurement through the trip coil assembly. A plurality of transition points may be identified based on at least one of the voltage measurement and the current measurement, the plurality of transition points corresponding to at least one of a mechanical characteristic and an electrical characteristic of the circuit breaker during a trip event. A predictive analysis may be performed based at least in part on the plurality of transition points. An indication of the predictive health may be displayed.

21 Claims, 8 Drawing Sheets

(56) References Cited

U.S. PATENT DOCUMENTS

| | | | |
|---|---|---|---|
| 6,058,353 A | 5/2000 | Goodpaster | |
| 6,292,717 B1* | 9/2001 | Alexander | G01R 19/2513 |
| | | | 340/6.1 |
| 6,611,724 B1* | 8/2003 | Buda | G05B 19/0428 |
| | | | 700/49 |
| 7,463,036 B2 | 12/2008 | Finey | |
| 2005/0103613 A1* | 5/2005 | Miller | H01H 71/04 |
| | | | 200/400 |
| 2009/0206059 A1* | 8/2009 | Kiko | H02J 3/14 |
| | | | 218/143 |

OTHER PUBLICATIONS

M. Knezev, Z. Djekic, and M. Kezunovic, "Automated Circuit Breaker Monitoring," in IEEE Power Engineering Society General Meeting, pp. 1-6, Jun. 24-28, 2007.

M. Kezunovic, Z. Ren, G. Latisko, D. R. Sevcik, J. S. Lucey, W. E. Cook, and E. A. Koch, "Automated Monitoring and Analysis of Circuit Breaker Operation," IEEE Transactions on Power Delivery, vol. 20, No. 3, pp. 1910-1918, Jul. 2005.

S. Strachan, S. McArthur, J. McDonald, W. Leggat, A. Campbell, "Trip Coil Signature Analysis and Interpretation for Distribution Circuit Breaker Condition Assessment and Diagnosis," 18th International Conference on Electricity Distribution, Turin, Jun. 6-9, 2005.

H. Johal, and M. J. Mousavi, "Coil Current Analysis Method for Predictive Maintenance of Circuit Breakers," Transmission and Distribution Conference and Exposition, 2008, pp. 1-7, Apr. 21-24, 2008.

C. Cheng, L. J. Chen, and W. S. Cao, "Diagnosing Medium Voltage GIS Circuit Breaker by Observing Trip Coil Current with Simulation and Actual Tests," Electric Power Components and Systems, pp. 181-194, 2008.

* cited by examiner

US 9,864,008 B2

ELECTRIC POWER SYSTEM CIRCUIT BREAKER TRIP DIAGNOSTIC

RELATED APPLICATION

The present application claims the benefit under 35 U.S.C. §119(e) of U.S. Provisional Patent Application No. 61/972,558, filed on Mar. 31, 2014, and titled "ELECTRIC POWER SYSTEM CIRCUIT BREAKER TRIP DIAGNOSTIC," which is incorporated herein by reference in its entirety.

TECHNICAL FIELD

This disclosure relates to monitoring of electric power system circuit breakers. More particularly, this disclosure relates to systems and methods for monitoring the health of a circuit breaker trip assembly.

BRIEF DESCRIPTION OF THE DRAWINGS

Non-limiting and non-exhaustive embodiments of the disclosure are described, including various embodiments of the disclosure with reference to the figures in which.

DETAILED DESCRIPTION

Figure 1:
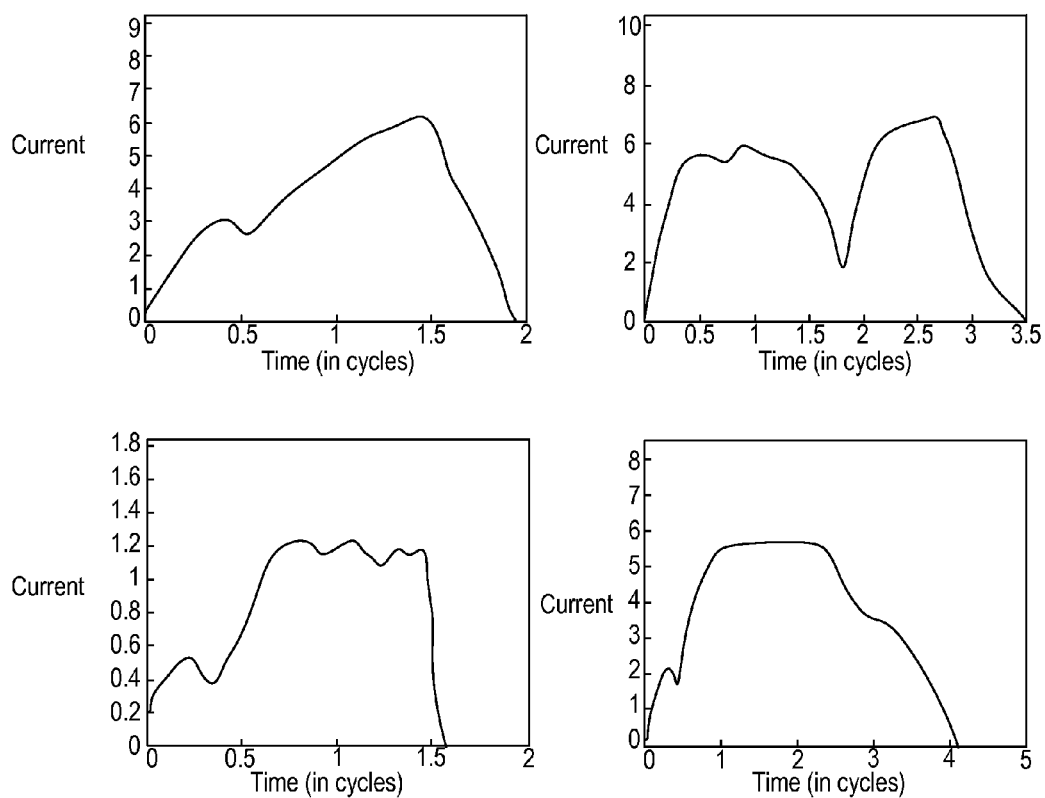
FIG. 1 illustrates four examples of current profiles of trip coils in various circuit breakers consistent with embodiments of the present disclosure.

Electric power delivery systems are designed to generate, transmit, and distribute electric energy to loads. Electric power delivery systems may include equipment such as: machines (electric generators, electric motors, and the like); power transformers, power transmission and delivery lines, circuit breakers, switches, buses, voltage regulators, capacitor banks, and the like. Such equipment may be monitored, controlled, automated, and/or protected using intelligent electronic devices (IEDs) that receive electric power delivery system information from the equipment, make decisions based on the information, and provide monitoring, control, protection, and/or automation outputs to the equipment. As used herein, monitoring, control, protection, and/or automation may generally be referred to as "control" unless otherwise specifically indicated.

In some embodiments, an IED may include, for example, remote terminal units, differential relays, distance relays, directional relays, feeder relays, overcurrent relays, voltage regulator controls, voltage relays, breaker failure relays, generator relays, motor relays, bay controllers, meters, recloser controls, governors, exciters, statcom controllers, static VAR compensator (SVC) controllers, on-load tap changer (OLTC) controllers, and the like. Further, in some embodiments, IEDs may be communicatively connected via a network that includes, for example, multiplexers, routers, hubs, gateways, firewalls, and/or switches to facilitate communications on the networks. Networking and communication devices may also be integrated into an IED and/or be in communication with an IED. As used herein, an IED may include a single discrete IED or a system of multiple IEDs operating together.

Efforts to automate and modernize the power grid involve automation and data analytics. Substation automation may provide for a variety of advantages, including online monitoring, diagnosis and prediction for the health condition of the substation assets. High voltage and medium voltage circuit breakers are a part of the reliability and protection systems included in an electric power distribution system. Circuit breakers perform a variety of functions, including isolating a faulty part of the power system that may result in a cascading outage. Circuit breakers may have an extended life of service (e.g., 40 years), but regardless of age, are expected to reliably perform trip and close operations. Circuit breaker operations cause wear and tear of the tripping assembly components, which eventually cause the circuit breaker to wear out. At the same time, long periods of non-operation may cause the mechanical parts inside a circuit breaker to move sluggishly, or in some circumstances fail to move at all.

Within circuit breakers, trip coil assemblies are responsible for actuating the tripping action. Monitoring the health of the trip coil and performing regular maintenance may help to ensure reliable operation of a circuit breaker. However, this approach requires the utility to send personnel to test the circuit breaker regardless of whether the circuit breaker is healthy and thus does not need maintenance. Servicing circuit breakers that are operating normally results in loss of time, efforts and financial resources. Further, inability to identify circuit breakers needing maintenance may result in failures between maintenance intervals which can remain undetected and may cause a failure of a portion of the electric power system.

Accordingly, performing the maintenance may consume resources that could be better utilized if the health of a circuit breaker is determined with automated techniques. Although automated techniques for diagnostic and prognostic analysis of the health condition of a circuit breaker trip coil may provide benefits, there are also challenges to such automated techniques. For example, different circuit breaker manufacturers may use different trip coil assemblies, each of which may have a different trip coil current profile. Further, there is no industry-accepted parametric or quantitative "index" that readily defines the health condition of a circuit breaker trip coil arrangement. Still further, the operating conditions associated with the circuit breaker may also impact the health of the circuit breaker.

Disclosed herein are various embodiments of systems and methods that may monitor the health of various components of a circuit breaker including a trip coil. Various embodiments of the present disclosure may provide suggestions for maintenance actions, may detect trip circuit abnormalities, may determine the cause of abnormal conditions, and may predict the possibility of potential health problems for the circuit breaker trip coil assembly.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need be executed only once, unless otherwise specified.

In some cases, well-known features, structures, or operations are not shown or described in detail. Furthermore, the described features, structures, or operations may be combined in any suitable manner in one or more embodiments. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

FIG. 1 illustrates variability among the current profiles of trip coils in various circuit breakers consistent with embodiments of the present disclosure. As may be observed, the profiles differ in a variety of characteristics, including response time and amplitude. Such differences may arise, for example, based on designs used by different manufacturers, different physical parameters, different operating conditions, and the like. In spite of the differences, however, the current profiles share certain features. Various embodiments of the present disclosure may perform a qualitative deterioration-based analysis instead of a quantitative index-based approach for health analysis to address the foregoing challenges.

Figure 2:
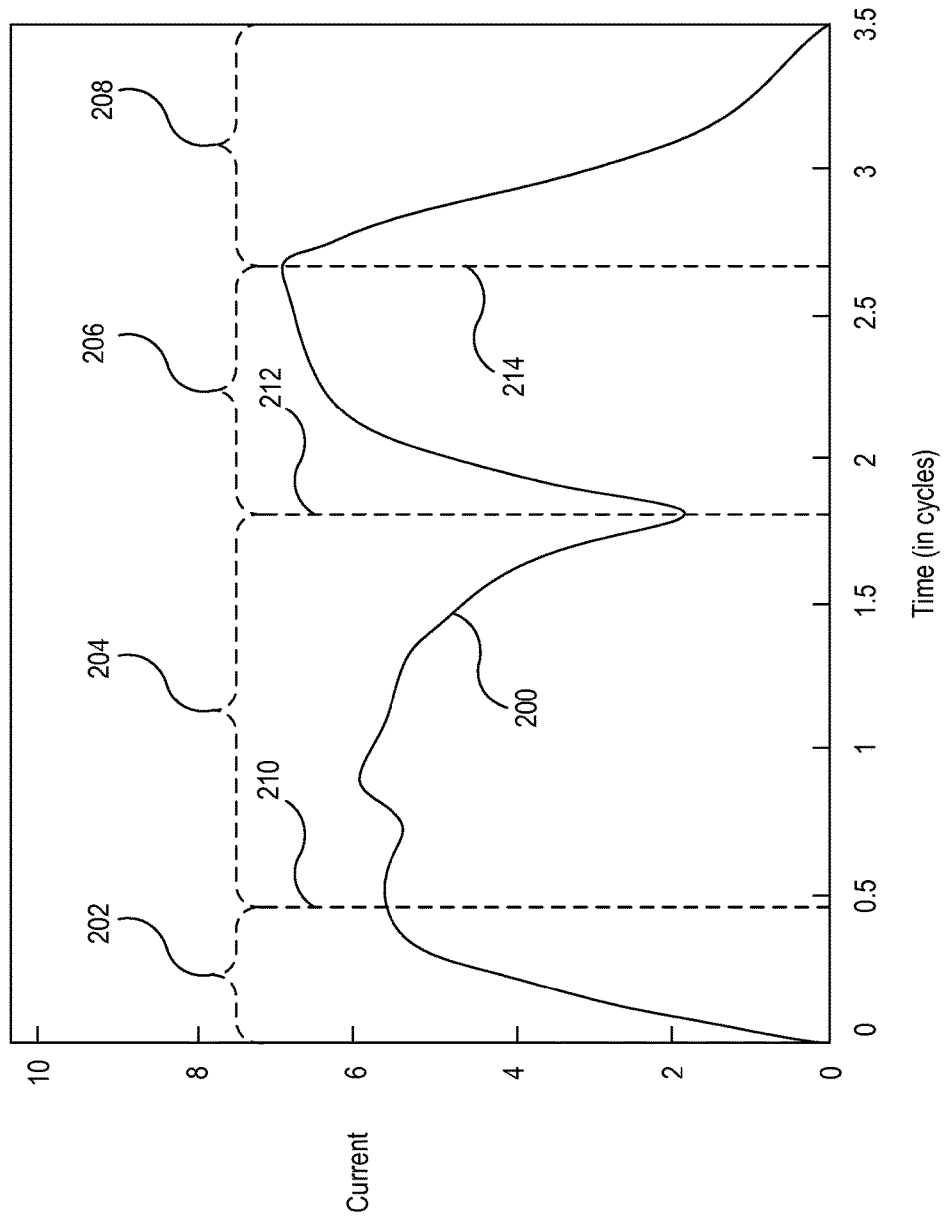
FIG. 2 illustrates various time segments associated with a current profile of a trip coil in a circuit breaker consistent with embodiments of the present disclosure.

FIG. 2 illustrates various time segments associated with a current profile 200 of a trip coil in a circuit breaker consistent with embodiments of the present disclosure. The current profile 200 includes three transition points, which are designated as 210, 212, and 214. The transition points define four time segments 202-208, the totality of which are defined between initial increase in current above a nominal level and return of the current profile to the nominal level.

The transition points 210, 212, and 214 may correspond to the mechanical and electrical characteristics of the trip coil. In the illustrated embodiment, the time segment from the beginning of the rise in current to the left of transition point 210 may be referred to as a current rise section 202. When a fault in the power circuit is detected by an IED, a contact in the control circuit changes its state. Usually the change is from an open position to a closed position, to activate the circuit breaker trip coil. Current starts flowing through the trip coil with activation of the control circuit and in the illustrated embodiment rises from a zero initial value to a non-zero value. The instantaneous amplitude of this current is governed by the electrical characteristics of the coil.

Once the current in the trip coil reaches a value significant enough to cause an electromagnetic force, the armature starts moving. This transition may correspond to transition point 210. When the armature starts moving, due to Lenz's law of electromagnetism, a back electromotive force is created in the coil to oppose the voltage. The result of this opposing voltage on the activating voltage is a reduction in the net coil voltage leading to a drop in the trip coil current.

The current 200 continues to decrease as long as the armature keeps moving until it hits a trip bar (not shown) to actuate tripping. This point may correspond to point 212. When the armature hits the trip bar, it stops moving. This results into reduction of the back electromotive force, and the net voltage across the trip coil again starts increasing. The current increases until its maximum value is reached. The current value depends directly on the resistance of the coil and the voltage applied across the coil.

After the trip bar actuates the mechanical assembly responsible for tripping in the power circuit, the power contacts of the circuit breaker opens, leading to the change of state of the auxiliary breaker contacts. This point corresponds to transition point 214. One of the normally closed breaker contacts in the trip control circuit open, resulting in the electrical discontinuity to the trip coil. With the actuating voltage now being unavailable to the trip coil, coil current decays to zero as a function of the R/X characteristics of the coil.

FIG. 3 illustrates a flow chart of a method 300 for evaluating the health of a circuit breaker trip coil consistent with embodiments of the present disclosure. The method may be driven by data collected by equipment in an electric power distribution system. Input data are current and voltage measurements for each trip event from a protective IED in the trip control circuit, along with temperature data from a Resister Temperature Detector (RTD) inside the circuit breaker chamber. After each circuit breaker trip event, the method 300 may analyze the data to determine a current and/or predictive health condition of the circuit breaker along with any recommended maintenance actions.

At 302, a plurality of trip coil parameters may be received. FIG. 3B illustrates a flow chart of a method for receiving a plurality of trip coil parameters that may be used in connection with the method illustrated in FIG. 3A consistent with embodiments of the present disclosure. In various embodiments, the plurality of trip coil parameters received at 302 may include one or more of: a rated current of the trip coil 320, the rated voltage of the trip coil 322, the rated temperature of the circuit breaker 324, and the temperature coefficient of the trip coil resistance 326. Various embodiments may include more or fewer parameters than those listed above.

At 304, user preferences for health analysis may be received. FIG. 3C illustrates a flow chart of a method for receiving user preferences for a health analysis of a circuit breaker that may be used in connection with the method illustrated in FIG. 3A consistent with embodiments of the present disclosure. The user preference may include a degree of sensitivity of trip coil 332 and an allowable percent deterioration of the trip coil 334.

At 306, it may be determined whether trip event data has occurred. Method 300 may remain at 306 until a trip event occurs. When a trip event occurs, measured values associated with the trip may be received at 307. In various embodiments, measured values associated with the trip event received at 307 may include time data, actual current measurements associated with the trip event, actual voltage measurements associated with the trip event, and actual temperature values associated with the trip event. In one embodiment, the time data may be obtained from an event report of an IED placed in the trip control circuit. The current series data may be a measurement of the current flowing through the trip coil during the trip event starting from the trip coil activation to its deactivation. The current data may also be obtained from an event report. The trip control circuit may be activated using a DC voltage and a DC current transducer may be used to measure the trip coil DC current. The voltage data may be a measurement of the DC voltage across the trip during the trip event. The temperature data may represent the temperature inside the circuit breaker chamber in proximity to the monitored trip coil. In some embodiments, the temperature may be obtained from a Resister Temperature Detector sensor.

At 308, the trip event data may be analyzed and transition points in the current profile may be identified. In one embodiment, a slope-detection based technique is used to identify transition points in the trip coil current profile to identify the 4 sections as in FIG. 2. In one specific embodiment, a first transition point may be identified as a local maximum following a rise in current through a trip coil. A threshold value may be established to ensure that the local maximum exceeds a specified value. A second transition point may be a local minimum. Again, a threshold value may be established to ensure that the local minimum is below a specified value. A third transition point may be identified as a local maximum. Other conditions may also be imposed on the determination of the transition points. For example, the local extremum may involve at least three consecutive values in the measured values associated with the trip event. The time duration of all the 4 sections segmented by the three transition points, may be computed for the event and stored in a real time database.

At 310, data may be analyzed and various parameters may be determined. The analysis of the data may include calculating or estimating various parameters used in method 300, evaluating whether data values fall within expected ranges, and the like. FIG. 3D illustrates a plurality of analyses that may be associated with analysis of data associated with a trip event consistent with embodiments of the present disclosure. In some embodiments, the analysis of the data performed at 310 in FIG. 3 may proceed as outlined in FIG. 3D. At 352, the amount of charge, Q, flowing through the trip coil during a trip event may be determined. The total amount of charge may be compared to an expected amount of charge, and variations in the amount of charge may be indicative of an electrical and/or mechanical problem in the circuit breaker. In one embodiment, the total amount of charge flowing through the trip coil during a particular trip event may be stored in a database and used to compute the windowed moving average of charge and time after the trip event. The windowed moving average of charge and time after a particular trip event may be compared to the windowed moving average of charge and time after the previous event. The variations in the windowed moving average of charge and time during consecutive events may be indicative of electrical and/or mechanical health deterioration or problems in the trip coil assembly. The window size may, in some embodiments, be determined by a user-specified degree of sensitivity value. A higher degree of sensitivity may result in a shorter window, while a lower degree of sensitivity may result in a longer window.

In various embodiments, the amount of charge, Q, may be computed using a trapezoidal method, and in one specific embodiment, the charge may be calculated using Eq. 1.

$$Q = \frac{\Delta t}{2}(I(t_0) + I(t_1)) + \frac{\Delta t}{2}(I(t_1) + I(t_2)) + \ldots + \frac{\Delta t}{2}(I(t_{n-1}) + I(t_n)), \quad \text{Eq. 1}$$

where $$\Delta t = \frac{t_{end} - t_{start}}{n}$$

In Eq. 1, $t_{start}$ is the time (in the time series data) from which the current starts rising above a threshold rated value in the trip coil during coil activation, and $t_{end}$ indicates the time when the trip coil current decays down below the threshold rated value during coil deactivation. In one specific embodiment, the threshold may be 1% of the rated current value of the trip coil. The value n may be the number of values between $t_{start}$ and $t_{end}$. In another embodiment, Eq. 1 may be further simplified, and the amount of charge Q may be calculated using Eq. 2.

$$Q = \frac{\Delta t}{2}(I(t_0) + 2I(t_1) + 2I(t_2) + \ldots + 2I(t_{n-1}) + I(t_n)) \quad \text{Eq. 2}$$

where $$\Delta t = \frac{t_{end} - t_{start}}{n}$$

At 354, an average voltage across the trip coil during the trip event may be determined. The average voltage value may be determined as a simple average or a moving average. In one embodiment, the voltage across the trip coil at the time of maximum trip coil during a particular trip event may be stored in a database and used to compute the windowed moving average of the trip coil voltage after the trip event. The windowed moving average of trip coil voltage after a particular trip event may be compared to the windowed moving average of trip coil voltage after the previous event. The variations in the windowed moving average of trip coil voltage during consecutive events are indicative of electrical problems in the trip coil assembly. In some embodiments, the window size may be determined by the degree of sensitivity value as will be determined by the degree of sensitivity value entered by the user. A higher degree of sensitivity may result in a shorter window, while a lower degree of sensitivity may result in a longer window.

At 356, the measured values of the current, voltage, resistance, and/or temperature measurements may be checked. In various embodiments, certain parameters may be used to verify the measured parameters and to determine whether the measured parameters exceed expected ranges. Measured values that exceed the expected ranges may either indicate a severe problem or may indicate that the sensing equipment is malfunctioning. In either event, appropriate action may be taken to remedy the problem.

At 358, an estimated resistance value may be computed for the trip event. To find the effect of temperature on the electrical properties of the trip coil, such as coil resistance, estimation of resistance may be performed and may be based on past and present temperature data, past resistance value, and temperature coefficient of resistance of the coil. The estimated resistance may then be compared with the actual resistance as computed from values associated with the trip event. Electrical problems resulting in an increased current flow through the trip coil may arise from an increase in voltage across trip coil and/or a decrease in resistance of the trip coil. An increase in voltage may be determined in various embodiments by comparing voltage measurements across multiple trip events. An evaluation of the decrease in resistance may be determined by comparison of an actual resistance value (as obtained from measured values associated with the trip event) to an ideal resistance value. In various embodiments, the ideal resistance value may be computed mathematically.

Figure 3A:
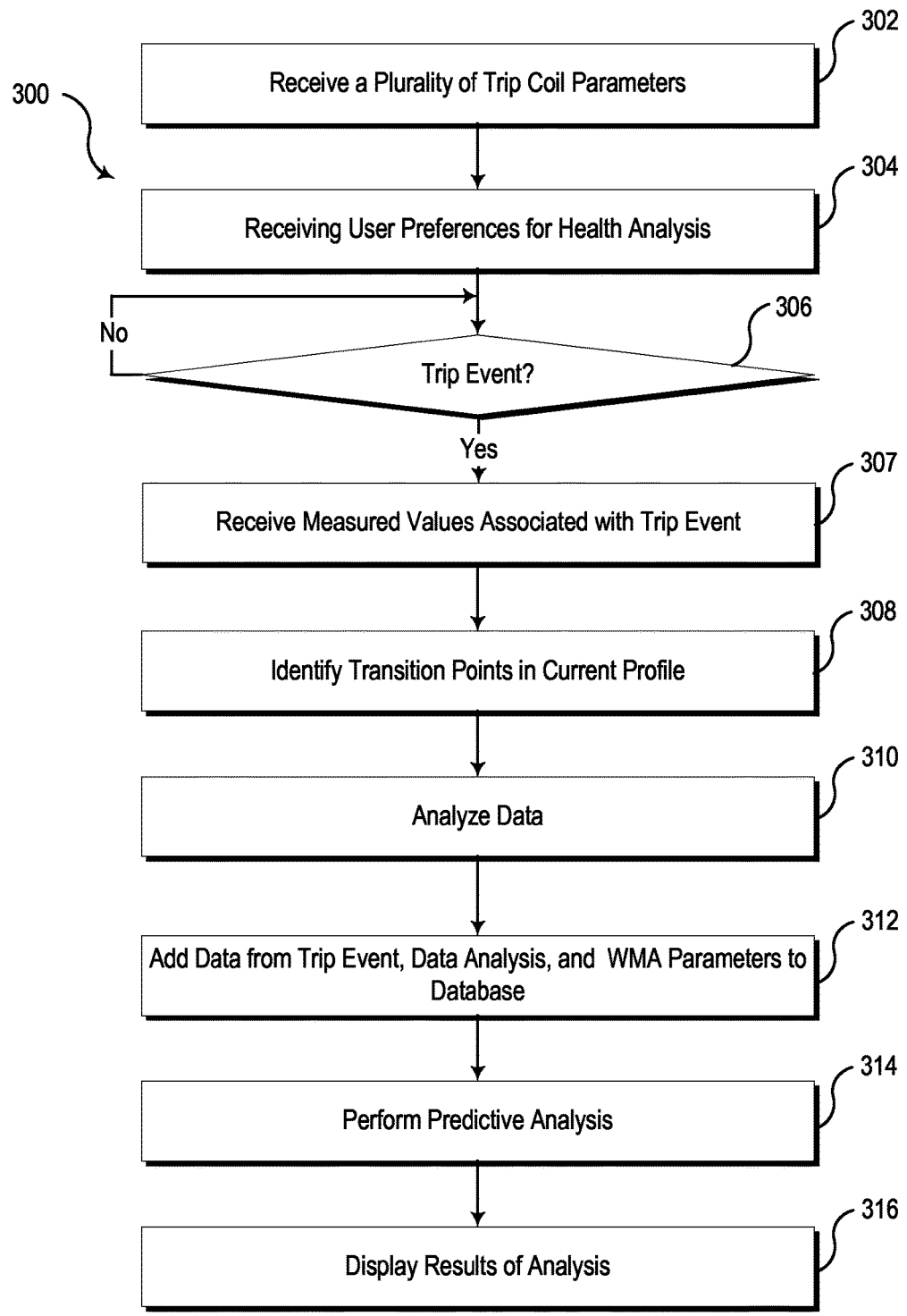
FIG. 3A illustrates a flow chart of a method for evaluating the health of a circuit breaker consistent with embodiments of the present disclosure.
Figure 3B:
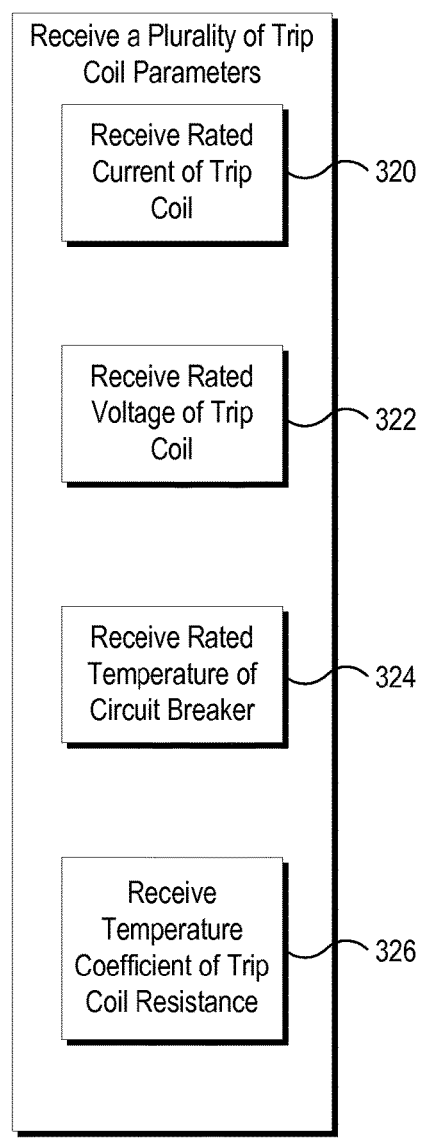
FIG. 3B illustrates a flow chart of a method for receiving a plurality of trip coil parameters that may be used in connection with the method illustrated in FIG. 3A consistent with embodiments of the present disclosure.
Figure 3C:
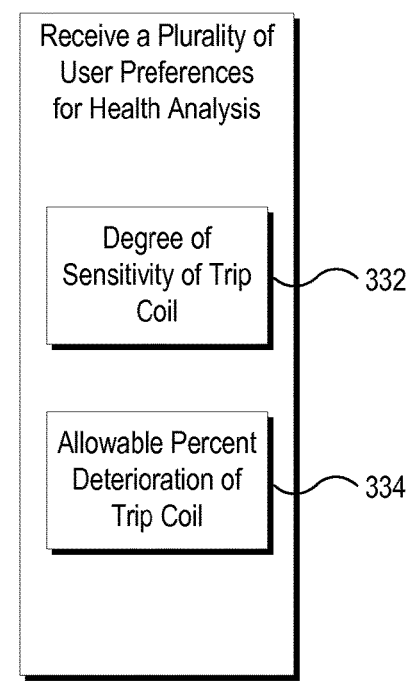
FIG. 3C illustrates a flow chart of a method for receiving user preferences for a health analysis of a circuit breaker that may be used in connection with the method illustrated in FIG. 3A consistent with embodiments of the present disclosure.
Figure 3D:
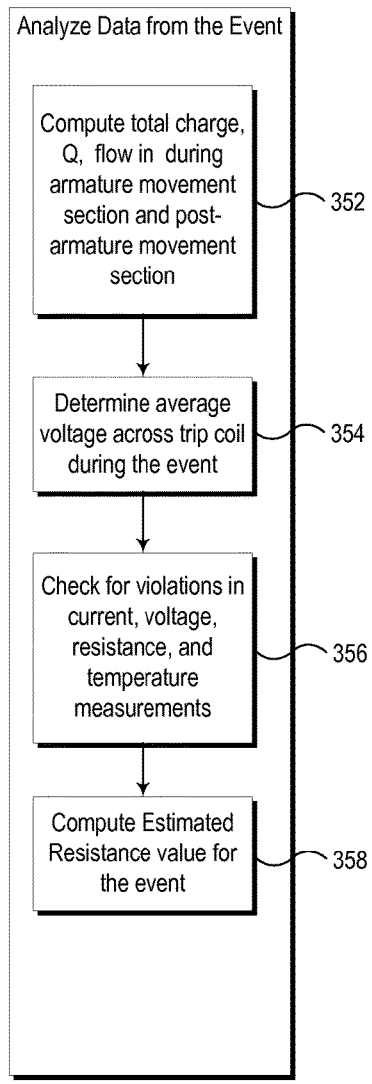
FIG. 3D illustrates a flow chart of a method for analyzing data from a trip event that may be used in connection with the method illustrated in FIG. 3A consistent with embodiments of the present disclosure.

Returning to a discussion of FIG. 3A, at 312, data may be added to a database that may be used in the analysis of subsequent events. Such data may be useful for determining sectional time durations, sectional charges, and voltages. Further, data from previous trip events may be used to predict future datasets. Such predictions may be based, for example, on a non-linear extrapolation technique. In some embodiments, multiple databases may be used. In one specific embodiment, historical data associated with transition points and associated sectional time duration values may be stored in one database, while a predictive database may archive historical data for predicting a future sectional charge.

At 314, a predictive analysis may be performed. In various embodiments, the predictive analysis may comprise consecutive event parameters based on the trip coil parameters and/or the user preferences. A variety of parameters may influence the predictive analysis, including the windowed moving average of sectional times, the windowed moving average of sectional charges, the windowed moving average of voltage, parameter violations, and estimated and actual resistance comparisons of consecutive trip events. These factors may be used for conditional checking and computation of the deviation of a particular circuit breaker from the acceptable parameters. As described above, in some embodiments users may specify an allowable deterioration parameter. The allowable deterioration parameter, may represent either more than usual current flowing for normal time duration, or normal current flowing for an unusually high duration of time according to various embodiments. In some embodiments, the allowable deterioration parameter may have a default value between about 10% and about 15% to detect tuning related problems, whereas the allowable deterioration parameter may have a default value between about 40% and about 50% to detect complete damage related problems.

The predictive analysis may further take into account a degree of sensitivity parameter. In various embodiments, a degree of sensitivity of the algorithm to deterioration of trip coil health may be specified. The degree of sensitivity may determine whether or not to treat a deviation from the normal as deterioration. In one embodiment, a user may specify a degree of sensitivity value ranging from "1" to "5". In this example, the degree of sensitivity of "1" is the least stringent and will not pick up low amount of deviations from the normal as considerable deterioration. On the other hand, a DOS value near "5" is the most stringent (or sensitive), and may thus pick up even the slightest deviation from the normal as an indication of deterioration. In some embodiments the degree of sensitivity may be selected at an approximate midpoint of a possible range (e.g., 3 out of 5) to reduce nuisance alarms by neglecting very small aberrations while being sensitive enough to identify a significant event.

The allowable deterioration parameter and the degree of sensitivity may be compared to measured values to determine if the trip coil health has deteriorated. The deterioration in trip coil health may be classified as a mechanical and/or an electrical type. The mechanical deterioration may be caused due to one or more of: improper armature alignment, improper lubrication between the armature and the trip coil core, improper arrangement of the trip bar. Electrical deterioration may be caused by an inter-winding short circuit in the trip coil, overvoltage across the trip coil, and/or change in coil resistance due to external factors such as temperature.

At 316, results of the analysis may be displayed. The results of the analysis may be displayed in a variety of ways, including on a display, in a report, in a standardized format, etc. In some embodiments, a report may be automatically generated for each trip event. Processing of the trip event data may occur in close temporal proximity to the event, and in some embodiments in near real time. Various types of information may be displayed in connection with the results.

Figure 3E:
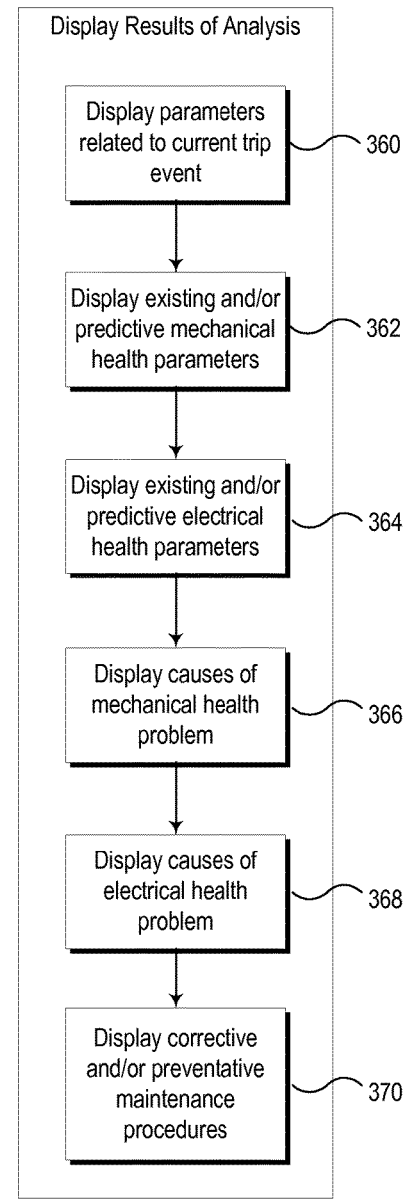
FIG. 3E illustrates a flow chart of a method for displaying results of an analysis of data from a trip event that may be used in connection with the method illustrated in FIG. 3A consistent with embodiments of the present disclosure.
Figure 4:
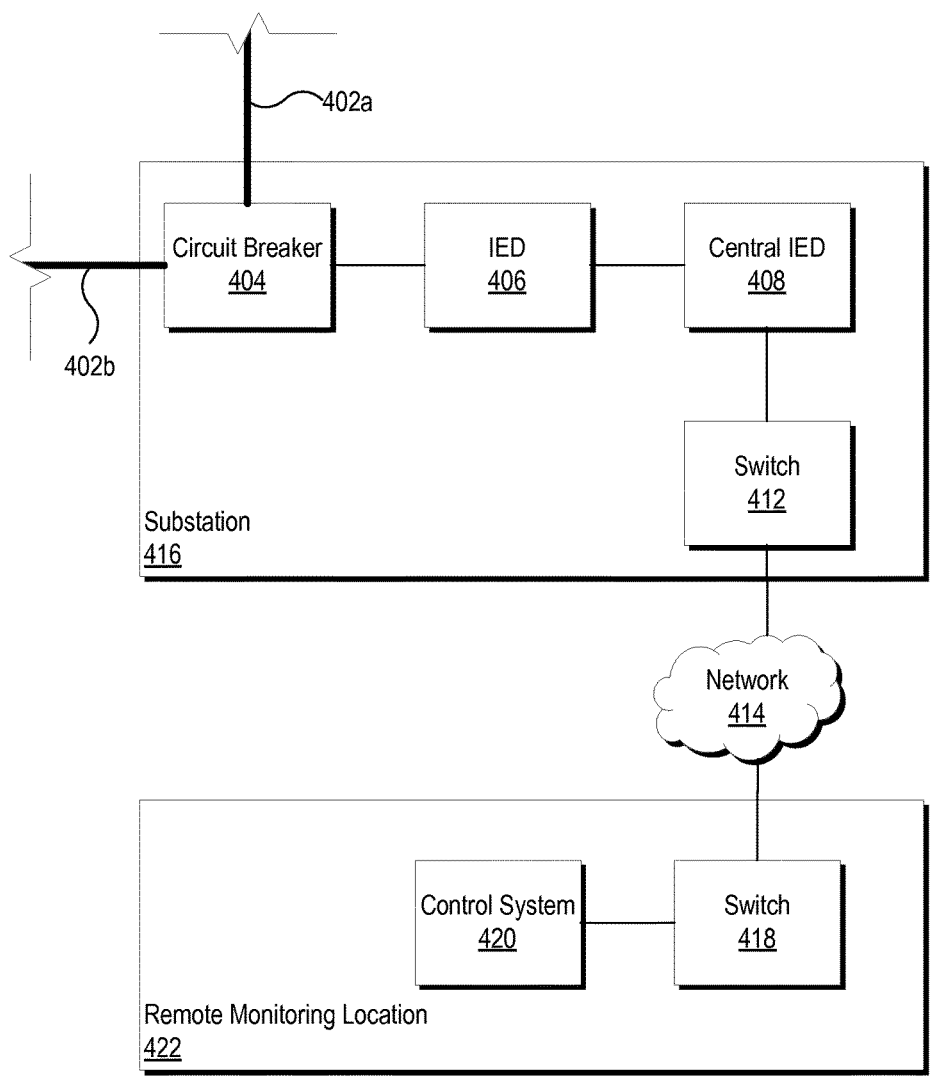
FIG. 4 illustrates a block diagram of a system for monitoring a circuit breaker from a remote monitoring location consistent with embodiments of the present disclosure.

FIG. 3E illustrates a flow chart of a method for displaying results of an analysis of data from a trip event that may be used in connection with the method illustrated in FIG. 3A consistent with embodiments of the present disclosure. At 360, parameters related to the current trip event may be displayed. The parameters associated with the current trip event may include: current rise time, armature movement time, post-Armature movement time, current decay time, circuit breaker tripping time, L/R time constant of trip coil, maximum trip coil current, trip coil voltage at the time of maximum current, minimum trip coil resistance, temperature during the trip event, and limit violation alarms (if any). At 362, an indication of existing and/or predictive mechanical health parameters may be displayed. Similarly, at 364, an indication of existing and/or predictive electrical health parameters may be displayed. The causes of mechanical or electrical health problems may be displayed at 366 and 368, respectively. Mechanical health problems may be caused by one or more of the following: improper armature alignment, improper lubrication between the armature and the trip coil core, and/or improper arrangement of the trip bar. Electrical health problems may be caused by one or more of inter-winding short circuit in the trip coil, overvoltage across the trip coil, and/or change in coil resistance due to external factors such as temperature. At 370, one or more corrective and/or preventative maintenance procedures may be displayed. A corrective procedure may rectify a presently detected electrical and/or mechanical problem. A preventative maintenance procedure may be directed toward an electrical and/or mechanical problem that may not presently interfere with operation of the circuit breaker, but that may result in a problem in the future. FIG. 4 illustrates a block diagram of a system for monitoring a circuit breaker from a remote monitoring location consistent with embodiments of the present disclosure. A substation 416 may house various types of electrical equipment. An electrical conductor 402 may be connected to circuit breaker 404. The circuit breaker 404 may be configured to electrically isolate segment 402a from segment 402b. Circuit breaker 404 may be in communication with IED 406, which may be configured to receive data from circuit breaker 404 relating to the operation of circuit breaker 404. Data may be communicated from IED 406 to central IED 408.

A central IED 408 may be configured to monitor and control the operation of equipment within substation 416 and to control communication between substation 416 and a network 414. A switch 412 may connect central IED 408 to the network 414. In some embodiments, a central IED 408 may be embodied as the SEL-3530 Real-Time Automation Controller (RTAC) available from Schweitzer Engineering Laboratories, Inc., of Pullman, Wash. In such embodiments, the RTAC may be connected to the external network through a secured Ethernet connection. An RTAC web browser may allow remote access to the RTAC and to view the real time and predictive information and messages regarding the health of a trip coil in circuit breaker 404. In various embodiments, information regarding the health of the circuit breaker 404 may be coded in Structured Text language in the RTAC. Once the event data is tagged and stored in the RTAC, the coded algorithm evaluates the real time health and predictive health of the monitored TC assembly.

A remote monitoring location 422 may also be connected to the network 414 via switch 418. Although not illustrated, the network 414 may utilize a variety of network technologies, and may comprise network devices such as modems, routers, firewalls, virtual private network servers, and the like. Further, the network 414 may be connected to other substations or components of an electric distribution system.

A control system 420 may be in communication with switch 418 and may receive data from substation 416. Control system 420 may embody a central monitoring system, such as a supervisory control and data acquisition (SCADA) system, an information system (IS), and/or a wide area control and situational awareness (WCSA) system.

Figure 5:
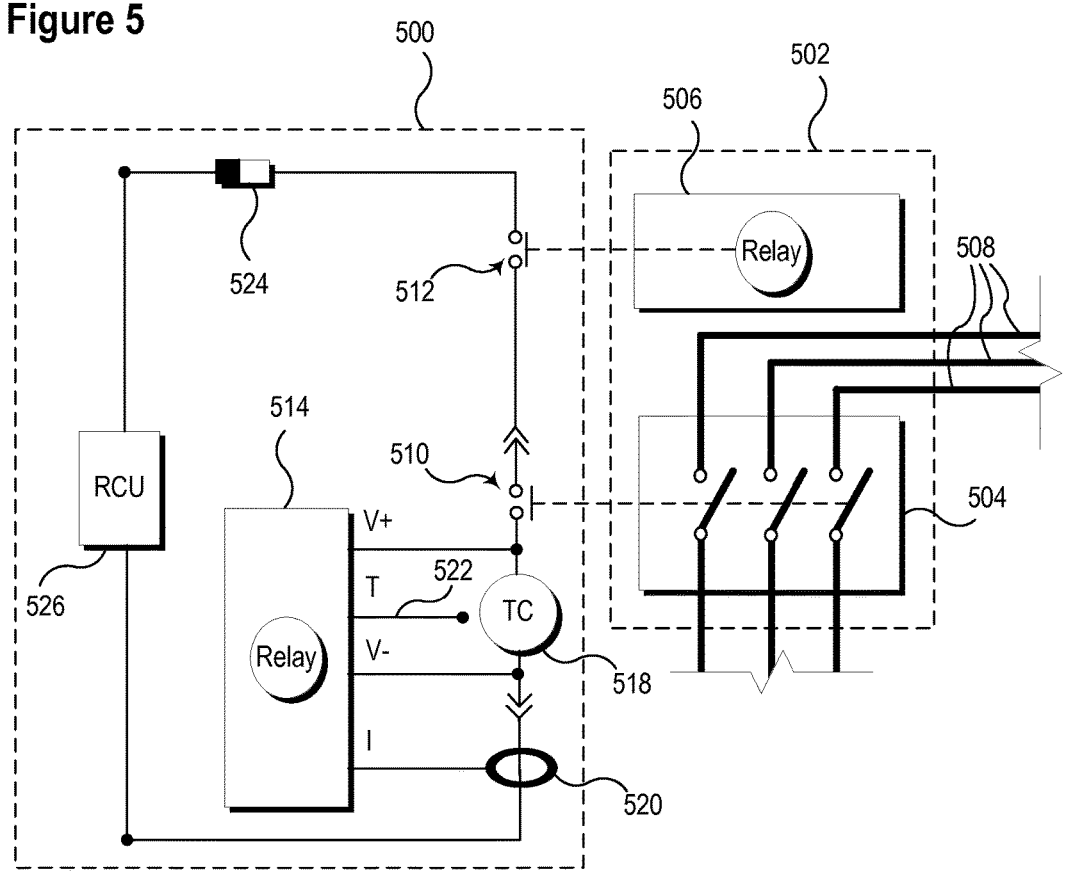
FIG. 5 illustrates a functional block diagram of a trip control circuit and a part of the power circuit consistent with embodiments of the present disclosure.

FIG. 5 shows a functional block diagram of a trip control circuit 500 and a portion of a power circuit 502 consistent with embodiments of the present disclosure. The portion of the power circuit 502 includes a power circuit breaker 504 and an IED 506 that monitors the current in the power circuit 502. The circuit breaker 504 may be configured to selectively interrupt current flowing through conductors 508. The conductors may represent three phases in a three phase power system.

The trip control circuit 500 includes a DC voltage supply from a Rectifier Capacitor Unit (RCU) 526 and the monitored trip coil getting this supply via the auxiliary contact 510 of the circuit breaker 504 and the contact 512 of the IED 506. The IED 514 in the control circuit has DC voltage transducers and DC current transducers to sense the DC voltage (V+ and V−) across the trip coil 518 along with the DC current (I) from a current sensor 520 through the trip coil during the occurrence of a circuit breaker trip event. A temperature sensor 522 may be disposed in proximity to the trip coil and may provide information regarding the temperature of the trip coil. A fuse 524 may be configured to disconnect the trip control circuit if higher than usual current is sensed to flow through the trip control circuit. In alternative embodiments, a mini-circuit breaker (MCB) or a miniature close circuit breaker (MCCB) may be used in place of fuse 524 to perform a similar structure.

Several aspects of the embodiments disclosed herein may be implemented as software modules or components. As used herein, a software module or component may include any type of computer instruction or computer executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc. that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions. In some embodiments, the computer or other electronic device may include a processing device such as a microprocessor, microcontroller, logic circuitry, or the like. The processing device may further include one or more special purpose processing devices such as an application specific interface circuit (ASIC), PAL, PLA, PLD, field programmable gate array (FPGA), or any other customizable or programmable device.

Figure 6:
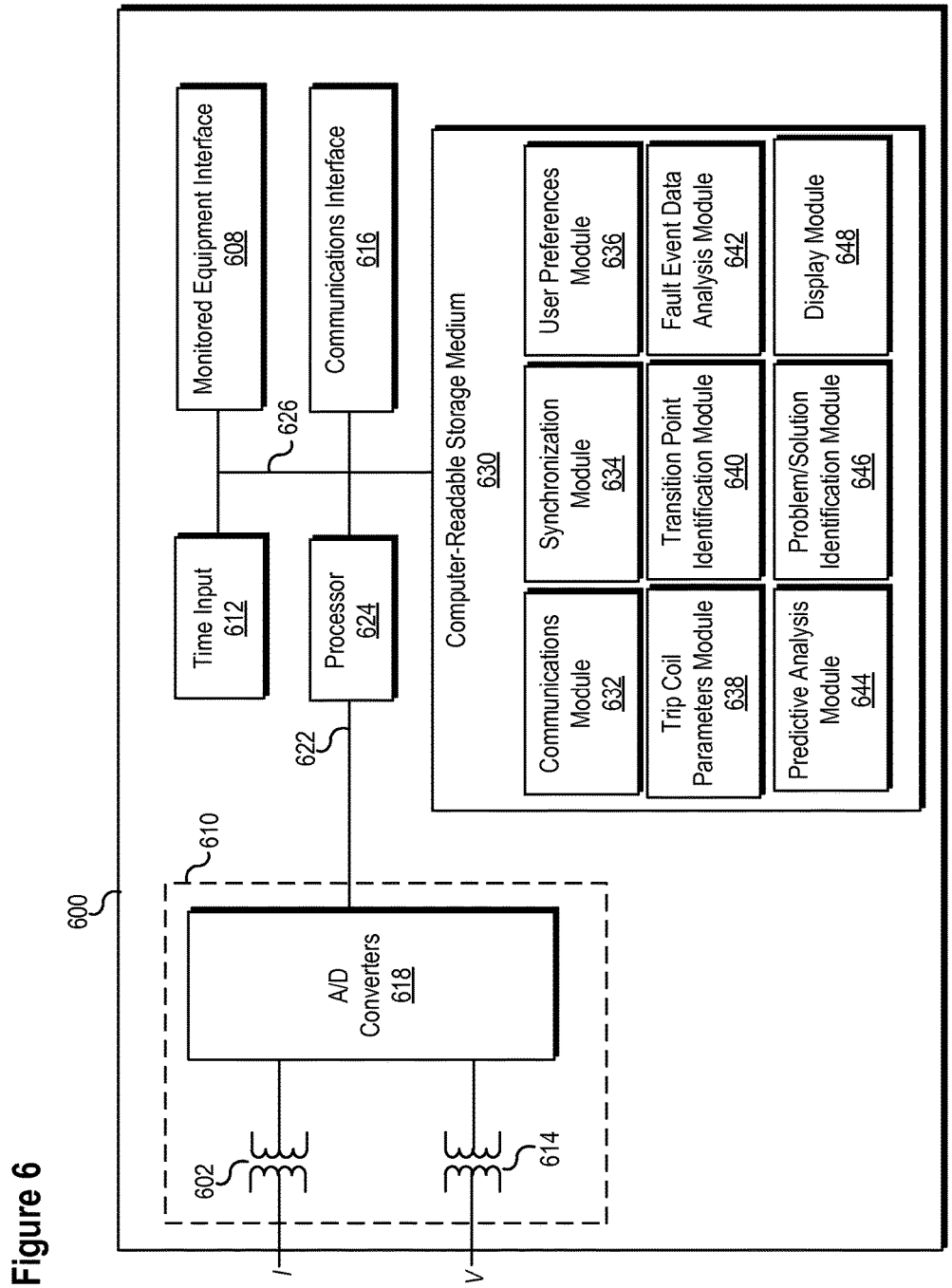
FIG. 6 illustrates a function block diagram of an IED configured to monitor one or more circuit breakers in an electric power system consistent with embodiments of the present disclosure.

FIG. 6 illustrates a function block diagram of an IED 600 configured to monitor one or more circuit breakers in an electric power system consistent with embodiments of the present disclosure. In certain embodiments, the system 600 may comprise an IED system configured to, among other things, monitor the health of a circuit breaker in an electric power distribution system. System 600 may be implemented in an IED using hardware, software, firmware, and/or any combination thereof. Although FIG. 6 illustrates an embodiment that includes hardware and software, various embodiments of the present disclosure may be implemented in embedded system, field programmable gate array implementations, and specifically designed specific interface circuit. Software functions described in connection with various software modules may be implemented in various types of hardware. A health monitoring component or sub-system configured to perform the various functions and methods described herein may be included in a variety of devices within an electric power distribution system. Moreover, certain components or functions described herein may be associated with other devices or performed by other devices. The specifically illustrated configuration is merely representative of one embodiment consistent with the present disclosure.

System 600 includes a communications interface 616 configured to communicate with other IEDs and/or system devices. In certain embodiments, the communications interface 616 may facilitate direct communication with another IED or communicate with another IED over a communications network. Communications interface 616 may facilitate communications with multiple IEDs. System 600 may further include a time input 612, which may be used to receive a time signal (e.g., a time signal) allowing system 600 to apply a time-stamp to the acquired samples. In certain embodiments, a common time reference may be received via communications interface 616, and accordingly, a separate time input may not be required for time-stamping and/or synchronization operations. One such embodiment may employ the IEEE 1588 protocol. A monitored equipment interface 608 may be configured to receive status information from, and issue control instructions to, a piece of monitored equipment such as a circuit breaker.

Processor 624 may be configured to process communications received via communications interface 616, time input 612, and/or monitored equipment interface 608. Processor 624 may operate using any number of processing rates and architectures. Processor 624 may be configured to perform various algorithms and calculations described herein. Processor 624 may be embodied as a general purpose integrated circuit, an application specific integrated circuit, a field-programmable gate array, and/or any other suitable programmable logic device.

In certain embodiments, system 600 may include a sensor component 610. In the illustrated embodiment, sensor component 610 is configured to gather data directly from a conductor (not shown) and may use, for example, transformers 602 and 614 and A/D converters 618 that may sample and/or digitize filtered waveforms to form corresponding digitized current and voltage signals provided to data bus 622. A/D converters 618 may include a single A/D converter or separate A/D converters for each incoming signal. A current signal may include separate current signals from each phase of a three-phase electric power system. A/D converters 618 may be connected to processor 624 by way of data bus 622, through which digitized representations of current and voltage signals may be transmitted to processor 624. In various embodiments, the digitized current and voltage signals may be used to determine the various parameters associated with monitoring the health of a circuit breaker as described herein.

A computer-readable storage medium 630 may be the repository of various software modules configured to perform any of the methods described herein. A data bus 626 may link monitored equipment interface 608, time input 612, communications interface 616, and computer-readable storage medium 630 to processor 624.

Communications module 632 may be configured to allow system 600 to communicate with any of a variety of external devices via communications interface 616. Communications module 632 may be configured for communication using a variety of data communication protocols (e.g., Ethernet, IEC 61850, etc.).

A synchronization module 634 may be configured to synchronize the operation of system 600 and/or to time-stamp data received from sensor component 610 and/or data received via communications interface 616. Synchronization module 634 may be configured to generate phasor representations of such measurements, which may be synchronized as synchrophasors in certain embodiments.

A user preferences module 636 may be configured to receive a plurality of user preferences. The user preference may include a degree of sensitivity of trip coil and an allowable percent deterioration of the trip coil. In some embodiments, the user preferences module 636 may implement the method for receiving user preferences for a health analysis of a circuit breaker illustrated in FIG. 3C.

A trip coil parameters module 638 may be configured to receive a plurality of trip coil parameters. In various embodiments, the plurality of trip coil parameters received may include one or more of: a rated current of the trip coil, the rated voltage of the trip coil, the rated temperature of the circuit breaker, and the temperature coefficient of the trip coil resistance. Various embodiments may include more or fewer parameters than those listed above. In some embodiments, the trip coil parameters module 638 may be configured to implement the method for receiving trip coil parameters illustrated in FIG. 3B.

A transition point identification module 640 may be configured to identify transition points associated with operation of a circuit breaker. In some embodiments, the transition point identification module may be configured to identify three transition points that define four time segments. The transition points may correspond to the mechanical and electrical characteristics of a trip coil in a circuit breaker. In some embodiments, the transition point identification module 640 may be configured to identify the transition points and periods identified and described in connection with FIG. 2.

A fault event data analysis module 642 may be configured to analyze data associated with a fault event. The analysis of the data may include calculating or estimating various parameters used in various methods disclosed herein. In some embodiments, the fault event data analysis module 642 may be configured to implement the method for analysis of data illustrated in FIG. 3D.

A predictive analysis module 644 may be configured to perform predictive analysis based on a variety of parameters and data. Such parameters may include the windowed moving average of sectional times, the windowed moving average of sectional charges, the windowed moving average of voltage, parameter violations, and estimated and actual resistance comparisons of consecutive trip events. These factors may be used for conditional checking and computation of the deviation of a particular circuit breaker from the acceptable parameters. As described above, in some embodiments users may specify an allowable deterioration parameter and a degree of sensitivity.

The problem/solution identification module 646 may be configured to classify deterioration in trip coil health as a mechanical and/or an electrical type and/or to provide suggested maintenance for ameliorating problems. The mechanical deterioration may be caused by one or more of: improper armature alignment, improper lubrication between the armature and the trip coil core, improper arrangement of the trip bar. Electrical deterioration may be caused by inter-winding short circuit in the trip coil, overvoltage across the trip coil, and/or change in coil resistance due to external factors such as temperature. The problem/solution identification module 646 may be configured to provide maintenance suggestions to resolve problems or extend the useful life of a circuit breaker.

A display module 648 may be configured to display results from analysis of the health of a circuit break. The results of the analysis may be displayed in a variety of ways, including on a display, in a report, in a standardized format, etc. In some embodiments, a report may be automatically generated for each trip event. In some embodiments, the display module 648 may be configured to implement the method for analysis of data illustrated in FIG. 3E.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A system for monitoring the health of a circuit breaker, comprising:
   a first input configured to receive a voltage measurement across a trip coil assembly associated with a circuit breaker;
   a second input configured to receive a current measurement through the trip coil assembly;
   a processor in communication with the first input and the second input; and
   a non-transitory computer-readable storage medium in communication with the processor, comprising instructions configured to cause the processor to:
      identify a plurality of transition points based on at least one of the voltage measurement and the current measurement, the plurality of transition points corresponding to at least one of a mechanical characteristic and an electrical characteristic of the circuit breaker during a trip event;
      perform a predictive analysis based at least in part on the plurality of transition points; and
      display an indication of a predictive health of the circuit breaker based on the predictive analysis.

2. The system of claim 1, wherein the computer-readable storage medium further comprises instructions configured to cause the processor to:
   identify a problem associated with the circuit breaker; and
   classify the problem as one of a mechanical problem and an electrical problem.

3. The system of claim 2, wherein the computer-readable storage medium further comprises instructions configured to cause the processor to:
   provide a maintenance recommendation to ameliorate the problem.

4. The system of claim 1, wherein the first input comprises a voltage transformer in electrical communication with the trip coil assembly.

5. The system of claim 1, wherein the second input comprises a current transformer in electrical communication with the trip coil assembly.

6. The system of claim 1, further comprising:
   a third input configured to receive a temperature measurement associated with the trip coil assembly; and
   wherein the predictive analysis is further based at least in part on the temperature measurement.

7. The system of claim 1, wherein the plurality of transition points define:
   a first temporal section in which current through the trip coil rises from an initial value;
   a second temporal section in which an armature of the circuit breaker moves;
   a third temporal section in which the armature movement ceases and the current increases to a peak value; and
   a fourth temporal section in which the current decreases from the peak value to the initial value.

8. The system of claim 7, wherein the computer-readable storage medium further comprises instructions configured to cause the processor to:
   calculate a total amount of charge flow through the trip coil for the third temporal section and the fourth temporal section;
   compare the total amount of charge to an expected charge; and
   determine an electrical problem based on a variation between the total amount of charge flow and the expected charge.

9. The system of claim 1, wherein the computer-readable storage medium further comprises instructions configured to cause the processor to:
   receive a plurality of user preferences; and
   wherein the predictive analysis is further based on the user preferences.

10. The system of claim 9, wherein the user preferences comprise an allowable deterioration of the trip coil and a degree of sensitivity of the trip coil.

11. The system of claim 1, wherein the computer-readable storage medium further comprises instructions configured to cause the processor to:
   receive a plurality of trip coil parameters; and
   wherein the predictive analysis is further based on comparison of the plurality of trip coil parameters to the voltage measurement and the current measurement.

12. The system of claim 11, wherein the plurality of trip coil parameters comprise at least one of: a trip coil rated current; a trip coil rated voltage; a circuit breaker rated temperature; and a trip coil resistance temperature coefficient.

13. A method for monitoring the health of a circuit breaker, comprising:
   receiving a voltage measurement across a trip coil assembly associated with a circuit breaker;
   receiving a current measurement through the trip coil assembly;
   identifying a plurality of transition points based on at least one of the voltage measurement and the current measurement, the plurality of transition points corresponding to at least one of a mechanical characteristic and an electrical characteristic of the circuit breaker during a trip event;
   performing a predictive analysis based at least in part on the plurality of transition points; and
   displaying an indication of a predictive health of the circuit breaker based on the predictive analysis.

14. The method of claim 13, further comprising:
   identifying a problem associated with the circuit breaker; and
   classifying the problem as one of a mechanical problem and an electrical problem.

15. The method of claim 14, further comprising:
   providing a maintenance recommendation to ameliorate the problem.

16. The method of claim 13, further comprising:
   receiving a temperature measurement associated with the trip coil assembly; and
   wherein the predictive analysis is further based at least in part on the temperature measurement.

17. The method of claim 13, further wherein the plurality of transition points define:
   a first temporal section in which current through the trip coil rises from an initial value;
   a second temporal section in which an armature of the circuit breaker moves;
   a third temporal section in which the armature movement ceases and the current increases to a peak value; and
   a fourth temporal section in which the current decreases from the peak value to the initial value.

18. The method of claim 17, further comprising:
   calculating a total amount of charge flow through the trip coil for the third temporal section and the fourth temporal section;
   comparing the total amount of charge to an expected charge; and determining an electrical problem based on a variation between the total amount of charge flow and the expected charge.

19. The method of claim 13, further comprising:
receiving a plurality of user preferences; and
wherein the predictive analysis is further based on the user preferences.

20. The method of claim 13, further comprising:
receiving a plurality of trip coil parameters; and
wherein the predictive analysis is further based on comparison of the plurality of trip coil parameters to the voltage measurement and the current measurement.

21. A system for monitoring the health of a circuit breaker, comprising:
- a first input configured to receive a voltage measurement across a trip coil assembly associated with a circuit breaker;
- a second input configured to receive a current measurement through the trip coil assembly;
- a third input configured to receive a temperature measurement associated with the trip coil assembly;
- a health monitoring component configured to:
  - receive a plurality of trip coil parameters;
  - identify a plurality of transition points based on at least one of the voltage measurement and the current measurement, the plurality of transition points corresponding to at least one of a mechanical characteristic and an electrical characteristic of the circuit breaker during a trip event;
  - perform a predictive analysis based at least in part on the plurality of transition points, the temperature measurement, and comparison of the plurality of trip coil parameters to the voltage measurement and the current measurement; and
  - display an indication of a predictive health of the circuit breaker based on the predictive analysis.

* * * * *